United States Patent
Hamre et al.

(10) Patent No.: US 7,305,312 B2
(45) Date of Patent: Dec. 4, 2007

(54) METHOD AND APPARATUS FOR RECORDING A REAL TIME SIGNAL

(75) Inventors: John David Hamre, Plymouth, MN (US); Peng Li, Fremont, CA (US); Steven J. Fraasch, Maple Grove, MN (US)

(73) Assignee: Wavecrest Corporation, Eden Prairie, MN (US)

( * ) Notice: Subject to any disclaimer, the term of this patent is extended or adjusted under 35 U.S.C. 154(b) by 0 days.

(21) Appl. No.: 11/329,962

(22) Filed: Jan. 10, 2006

(65) Prior Publication Data
US 2006/0195277 A1    Aug. 31, 2006

Related U.S. Application Data

(60) Provisional application No. 60/642,820, filed on Jan. 10, 2005.

(51) Int. Cl.
*G01R 13/00* (2006.01)
*G01R 13/20* (2006.01)

(52) U.S. Cl. .................. 702/69; 324/121 R
(58) Field of Classification Search ........... 702/69; 324/121 R
See application file for complete search history.

(56) References Cited

U.S. PATENT DOCUMENTS

| | | | | |
|---|---|---|---|---|
| 4,585,975 | A * | 4/1986 | Wimmer | 315/307 |
| 6,753,677 | B1 * | 6/2004 | Weller et al. | 324/121 R |
| 2005/0099235 | A1 * | 5/2005 | Sakamoto et al. | 331/16 |
| 2005/0189950 | A1 * | 9/2005 | Lu | 324/606 |

OTHER PUBLICATIONS

Takamiya et al., "A Sampling Oscilloscope Macro toward Feedback Physical Design Methodology", 2004, IEEE, pp. 240-243.*

* cited by examiner

*Primary Examiner*—Michael P. Nghiem
*Assistant Examiner*—Cindy D. Khuu
(74) *Attorney, Agent, or Firm*—Merchant & Gould P.C.

(57) ABSTRACT

A system, method, and apparatus for obtaining a record of logic level transitions within a signal, and for accurately determining a voltage-time pair exhibited by the signal. To achieve these ends, a front-end device may be mated to a real-time sampling system, such as an oscilloscope. The front-end device effectively permits the oscilloscope to observe signals exhibiting greater data rates than otherwise possible without the front-end device.

8 Claims, 13 Drawing Sheets

| Relative Amplitude | Correction Factor |
|---|---|
| ⋮ | ⋮ |
| $a_{baseline,m-2}$ | -2 ps |
| $a_{baseline,m-1}$ | -1 ps |
| $a_{baseline,m}$ | 0 ps |
| $a_{baseline,m+1}$ | +1 ps |
| $a_{baseline,m+2}$ | +2 ps |
| ⋮ | ⋮ |

$a_{baseline}$ ⇒ [table] ⇒ correction factor $t_{sample} = n * rate_{sampling} + \text{correction factor}$

METHOD AND APPARATUS FOR RECORDING A REAL TIME SIGNAL

RELATED APPLICATIONS

This application claims priority to U.S. Provisional Patent Application No. 60/642,820, entitled "METHOD AND APPARATUS FOR RECORDING A REAL TIME SIGNAL," filed Jan. 10, 2005, which is hereby incorporated by reference for all it teaches.

FIELD OF THE INVENTION

The present invention relates to a method and apparatus for measuring a time varying parameter; more specifically the invention relates to an apparatus for a real time signal threshold event recording and analyzing method and apparatus; and more particularly still, the invention relates to recording a real time signal in order to analyze the jitter of the signal.

BACKGROUND OF INVENTION

One of the most common tasks involving circuit design relates to the design and evaluation of data communication paths. Binary encoded serial data communication technology has become the predominant form of interconnect for many communication standards and is being chosen almost exclusively for new applications that require high data rates. A typical serial data communication channel employs a data transmission scheme that utilizes a single electrical or optical path over which the data is sent. An appropriate data encoding scheme provides for the extraction of the data signal at the receiver. The use of a single signal transmission path avoids the problems of inter-channel synchronization encountered when using multiple, synchronous data channels.

Although the use of a single signal transmission path avoids the multiple channel synchronization issue, it also forces the data rate of that single channel to a maximum. Since the time between symbols is inversely proportional to the data rate, ever increasing data rates cause the time separating data symbols to decrease. As inter-symbol spacing decreases, the symbols begin to interfere with one another causing the determination of the data symbol to become difficult, ultimately resulting in bit errors. The presence of noise in the system compounds the problem of determining the correct value of a data symbol.

The vast majority of current high speed serial data communications standards employ Non Return to Zero (NRZ) encoding with a small minority utilizing Return to Zero (RZ) and other schemes. NRZ and RZ encoding are binary encoding schemes. The NRZ encoding scheme is very straightforward in that a high amplitude represents a "1" value and a low amplitude represents a "0" value. For RZ encoding a "1" value is represented by a positive going pulse and a low value is represented by a low amplitude. In either of these encoding schemes, the locations of transitions from one amplitude level to another can give a good estimation of the bit error rate of the system. Since low system bit error rate is the goal of all data communication systems, it is also the primary metric provided by all serial data communication measurement systems.

The primary types of equipment used to measure the fidelity of serial communication systems are oscilloscopes, time interval analyzers and bit error rate test sets. Each of these measurement methods generally relate the location of the transitions in time relative to the ideal sampling time along some reference amplitude threshold.

In the case of oscilloscopes, the waveform amplitude is sampled at known times. There are two types of oscilloscopes that are employed for this type of analysis.

The first type is a real time or digitizing sampling oscilloscope. This oscilloscope sequentially samples the waveform at a very high rate (e.g., a rate high enough so that each data symbol is sampled a few times). However, having finite memory, the real time oscilloscope can only digitize the waveform for a number of samples equal to the memory depth of the oscilloscope. This results in a real time amplitude record of the waveform for a period of time. A real time record enables a number of analysis techniques that take into account the displacement of transitions relative to an ideal transition location. The ideal transition location is derived from the entire sequence of transition locations and can incorporate numerous mathematical techniques to emulate receiver functionality without the need for hardware to emulate the receiver.

Deficiencies related to real time oscilloscopes have to do with the rate at which they can digitize waveforms. As was stated earlier, at the highest data rates only a few samples are obtained for each data symbol. This necessitates the need to estimate the transition points based on interpolation. As will be appreciated, the resulting error is oftentimes significant. Another shortcoming of real time oscilloscopes is that they have bandwidth limitations that are significant relative to the data rates used in serial data communication signals which again result in errors significant to measurement accuracy.

The second type of oscilloscope is an equivalent time oscilloscope which measures the waveform in relation to a repeating trigger event. This measurement is under-sampled in the sense that only one out of a plurality of triggers is selected for instigation of an amplitude meaurement. The benefits of this type of measurement are that the sampling hardware can measure the signal with very high bandwidth (e.g., greater than 60 gigahertz) resulting in very accurate reproduction of all of the waveform—unlike the real time oscilloscopes which are quite limited in bandwidth.

One major deficiency of equivalent time measurements is related to the under-sampling. In an under-sampled measurement technique, the measurements can only be related to one another via the fact that they were initiated by similar trigger events. No other information is available regarding the relationship of one sample to another. Consequently if an ideal sampling time is desired for analysis purposes, either a reference "clock" signal must be supplied to the oscilloscope, usually in the form of a trigger, or one must be extracted from the incoming waveform with clock recovery hardware. However, even with the presence of the reference clock signal, the temporal measurement to measurement information available with a real time oscilloscope cannot be produced by the equivalent time oscilloscope. This significantly limits the types of analyses that are supported by the data, and consequently limits the types of diagnostic conclusions that can be reached.

Time interval analyzers have circuitry that directly measures the transition points avoiding the estimation error encountered by real time oscilloscopes due to interpolation. They are, however, an under-sampled measurement system and suffer from similar limitations as the equivalent time oscilloscopes.

Bit error rate test sets have clock recovery built in and actually sample the incoming waveform at an estimated ideal sampling time and threshold. Since the result of this sampling is merely digital and not parametric, only a bit error rate is determined. In order to estimate bit error rate, the sampling point must be moved and consequent bit error rates must be measured at each new sampling point. This method is also typically very slow relative to other methods.

Shortcomings of the current measurement methods are summarized:
1. Real time oscilloscopes
   a. Systems do not measure threshold transition locations directly, must estimate them using interpolation.
   b. Bandwidth limitations relative to data rate reduce accuracy and limit data rate measurement capability.
2. Equivalent time oscilloscope
   a. Under-sampling results in a non-real time record which cannot support as rich an analysis as a real time record.
   b. Low measurement rate, long acquisition time
   c. Trigger is required, but not always available.
   d. May require clock recovery.
3. Time interval analyzer
   a. Under-sampling results in a non-real time record which cannot support as rich an analysis as a real time record.
   b. Limited amplitude analysis capability
   c. May require clock recovery.
4. Bit error rate test set
   a. Very limited parametric measurement capability
   b. Very slow acquisition In view of the foregoing, there arises a need for an improved threshold crossing time measurement and recording method and apparatus. The following invention addresses and helps to solve and/or minimize the shortcomings of the prior art.

SUMMARY

The invention relates to a real time threshold crossing time measurement system which provides a real time record for all transitions occurring over a period of time. While amplitude to time will be described as the transition event in connection with the various preferred embodiments described below, the present invention is not limited to this measurement or particular measurement. Instead the present invention may be employed in many other environments in which time varying parameters and functions are recorded for subsequent analysis.

Devices constructed in accordance with the principles of the present invention are capable of measuring edge locations at a very high rate (billions of measurements/second) for a period of time limited by the memory depth of the acquisition system. The acquisition and storage of the edge locations addresses the real time oscilloscope accuracy problems associated with the limited bandwidth and interpolation. It also addresses equivalent time oscilloscope and time interval analyzer limitations related to under-sampling by providing a real time record. This also avoids the necessity for clock recovery. The speed at which measurements are taken addresses the measurement speed limitations related to the equivalent time oscilloscope and the bit error test set.

Several embodiments are presented that can perform the measurement of the present invention. In each of the embodiments, threshold crossings are converted into known waveforms that are easily measured by a very high speed analog to digital conversion system. The known waveforms are chosen so that the conversion system is able to sufficiently sample so as to infer the time location of the threshold crossing.

An oscilloscope system has also been devised based to implement the time measurement system of the present invention. This oscilloscope system utilizes commodity, high bandwidth, track and hold technology to samples signals at a rate much higher than equivalent time oscilloscopes. The trigger for the sampling system is internal, thereby eliminating the need for an external trigger. The time measurement system measures the trigger times at the same time that the amplitude of the waveform is being measured—resulting in an under-sampled but real time record. This can all be done at the same time the threshold transition locations are being measured as described above. A trigger method that creates an uncorrelated random trigger pattern was conceived that enables extremely fast measurements that are useful for eye diagram analysis. Two methods for enhancing amplitude and timing accuracy have been conceived to allow this oscilloscope system to meet and or exceed the performance characteristics of the equivalent time oscilloscope.

According to some embodiments, a method of determining a time of occurrence of a logic level transition in a signal includes providing the signal to a comparator, so that, at an output of the comparator, a step signal having a substantially predetermined shape is generated, upon the signal exhibiting a logic level transition. The step signal is filtered, yielding a filtered step signal exhibiting a slowed transition from a first voltage level to a second voltage level. The filtered step signal is sampled with a signal measurement device, so as to obtain at least one sample of the slowed voltage transition. The at least one sample of the slowed voltage transition and the substantially predetermined shape of the step signal are used to determine the time of occurrence of the logic level transition.

According to some embodiments, a method of sampling a signal includes providing the signal to a track and hold element. The track and hold element is caused to perform a hold operation, thereby yielding a held signal exhibiting a substantially constant voltage level. The act of causing the hold operation includes providing a track signal having a substantially predetermined shape to the track and hold element. The held signal is provided to a signal measurement device. The track signal is provided to the signal measurement device, so that the signal measurement device samples the track signal, and obtains at least one sample on an edge of the track signal. The at least one sample and the predetermined shape of the track signal are used to determine a time value associated with the held signal.

According to some embodiments, a method of determining a correction factor for a signal obtained by a probe and measured with a measuring system includes providing a reference signal to a conductive pad. Coupling the pad with the probe. The measurement system is used to measure, in frequency space or time space, the reference signal. The measured frequency-space step signal is divided by a frequency-space representation of the signal provided to the pad, to arrive at the correction factor.

It will be appreciated that while the invention is described in connection with the preferred embodiments in the context of serial data communications, the invention can be applied to more general signal analysis as well. Further, it will be appreciated that the present invention need not include each and every one of the preceding features. Instead, methods and apparatus constructed in accordance with the principles of the present invention may utilize one or more of the identified features.

While the invention will be described with respect to preferred embodiment configurations and with respect to particular devices used therein, it will be understood that the invention is not to be construed as limited in any manner by either such configuration or components described herein. These and other variations of the invention will become apparent to those skilled in the art upon a more detailed description of the invention.

For a better understanding of the invention, reference should be had to the drawings which form a part hereof and to the accompanying descriptive matter, in which there is illustrated and described a preferred embodiment of the invention.

BRIEF DESCRIPTION OF DRAWINGS

Referring to the drawings, wherein like numerals represent like parts throughout the several views.

DETAILED DESCRIPTION

Real Time Measurement System

Figure 9:
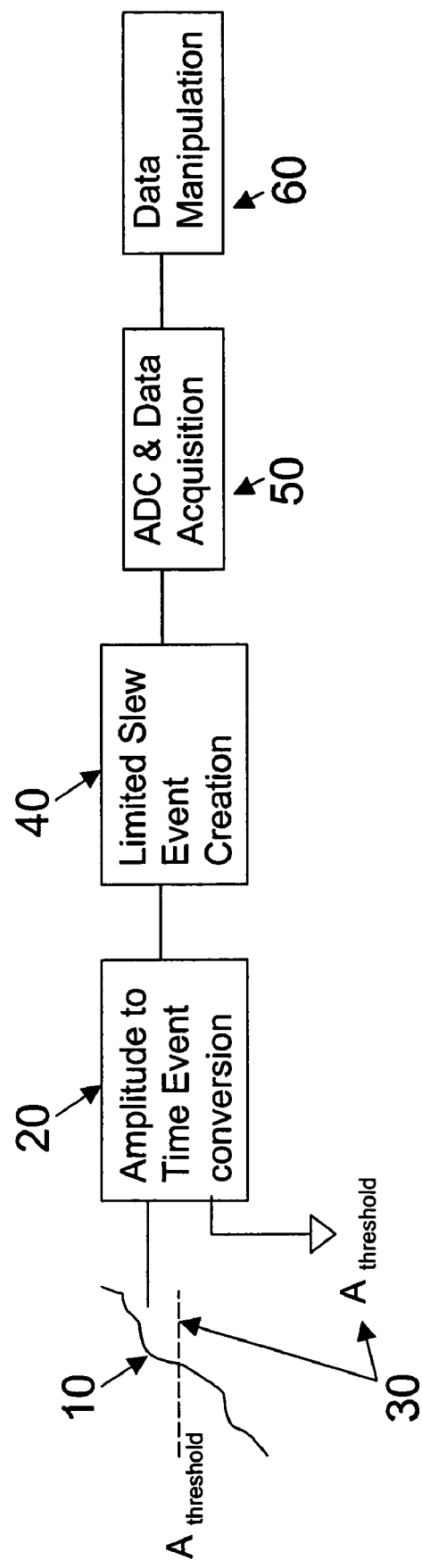
FIG. 9 illustrates a basic block diagram for implementing the real-time time measurement method of the present invention.

Turning first to FIG. 9, an illustrative block diagram of a system that can be used to determine the time at which the input waveform 10 crosses the amplitude $A_{Threshold}$ is shown. The input waveform 10 and the threshold amplitude $A_{Threshold}$ 30 are applied to the time event conversion block 20. The time event conversion block 20 generates an output event, such as a voltage transition, when the input amplitude 10 crosses the amplitude threshold 30. The output of the time event conversion block 20 is applied to the input to the limited slew event creation block 40. Upon receipt of the time event, the limited slew event creation block 40 initiates an output event that includes an amplitude variation that is of fixed and repeatable amplitude and duration. The event's change in amplitude with respect to time, or slew rate, is limited so that the analog to digital (ADC) and data acquisition block 50 can sample the event to determine a time that corresponds to the time that the event was initiated. The slew rate limiting is effectively equivalent to bandwidth limiting for the purposes of avoiding aliasing in the analog to digital conversion process. The data manipulation block 60 is used for collecting and manipulating data.

It is important to note that the amplitude to time event conversion block could be substituted with a block that converted some other parameter to a time event. For example, optical polarity or some other time varying parameter may be measured, thereby allowing this system to be utilized in connection with measuring any number of time varying parameters. More specifically, the time varying parameter could be a magnetic field. In this case, the magnetic field could be picked up with a magnetic loop antenna, amplified and applied to a limiting amplifier. The output of the amplifier would create the time event that is applied to the limited slew event creation block 40. The resulting system would measure the time when the magnetic field strength exceeded a certain level.

Figure 1:
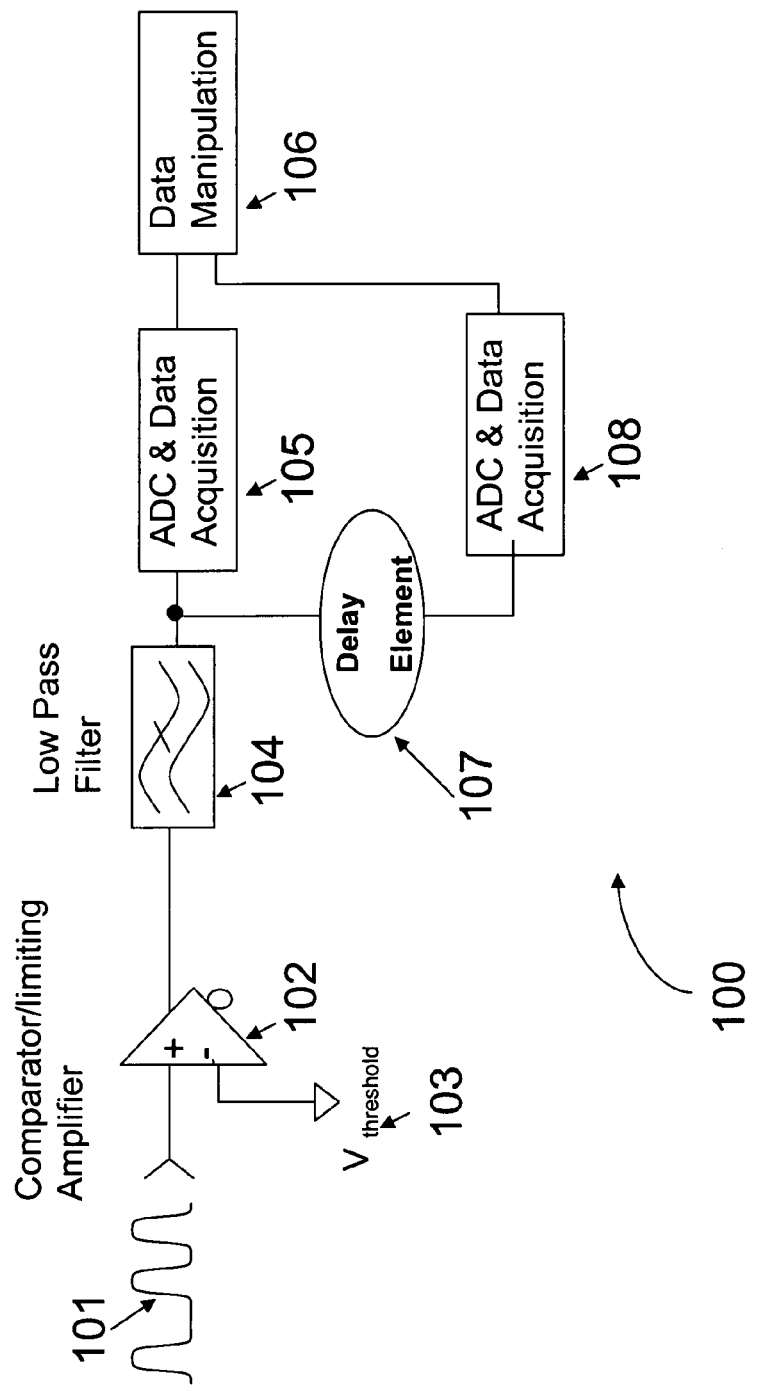
FIG. 1 illustrates a block diagram for one implementation of the real-time time measurement method of the present invention.

Turning next to FIG. 1, a waveform to be measured 101 is presented to the positive input of a comparator 102 at 100 while the negative input to the comparator 101 is set to a voltage $V_{Threshold}$ 103. The timing of the transition at the output of the comparator 101 is representative of when the input waveform crossed the threshold amplitude. Given that the gain of the comparator function is high enough, and the comparator circuitry is chosen to have sufficient bandwidth, the step at the output of the comparator 101 will have a very fast transition and settle time relative to the step response of the succeeding filter 104. The comparator output must settle quickly if the output of the filter is expected to settle quickly. Quick settle times ensure that energy from a previous transition does not affect the current transition resulting in measurement error.

The output of the comparator 102 is applied to the input of a filter 104. The characteristics of the filter 104 are chosen so that the resulting step response of the system has a very short settling time. The filter 104 also has the characteristics of limiting the bandwidth of the signal that exits the filter and is applied to the input of the analog to digital conversion (ADC) and data collection block 105. The aforementioned filter 104 may be embodied as a bandwidth-limited oscilloscope. In other words, the bandwidth limitations of the circuitry of an oscilloscope may serve the function of the filter 104. This data collection block can take the form of an assembly comprised of standard circuits that are available on the market or it can be in the form of a real time sampling oscilloscope such as an Agilent Infiniium 80000 series oscilloscope or a Tektronix TDS6000 series oscilloscope, as well or any other suitable conversion technology. The data in the ADC and data collection block 105 are accessed by the data manipulation block 106 which operates on the data to extract the timing information. It is possible to effectively double the sampling rate of the ADC and data collection system by adding an additional ADC and data collection block 108 in conjunction with the delay element 107. The delay is one half of the sampling period effectively interleaving sampling points. The example of doubling the sampling rate is given although any arbitrary number of additional channels can be added in order to increase the effective sampling rate.

Figure 2:
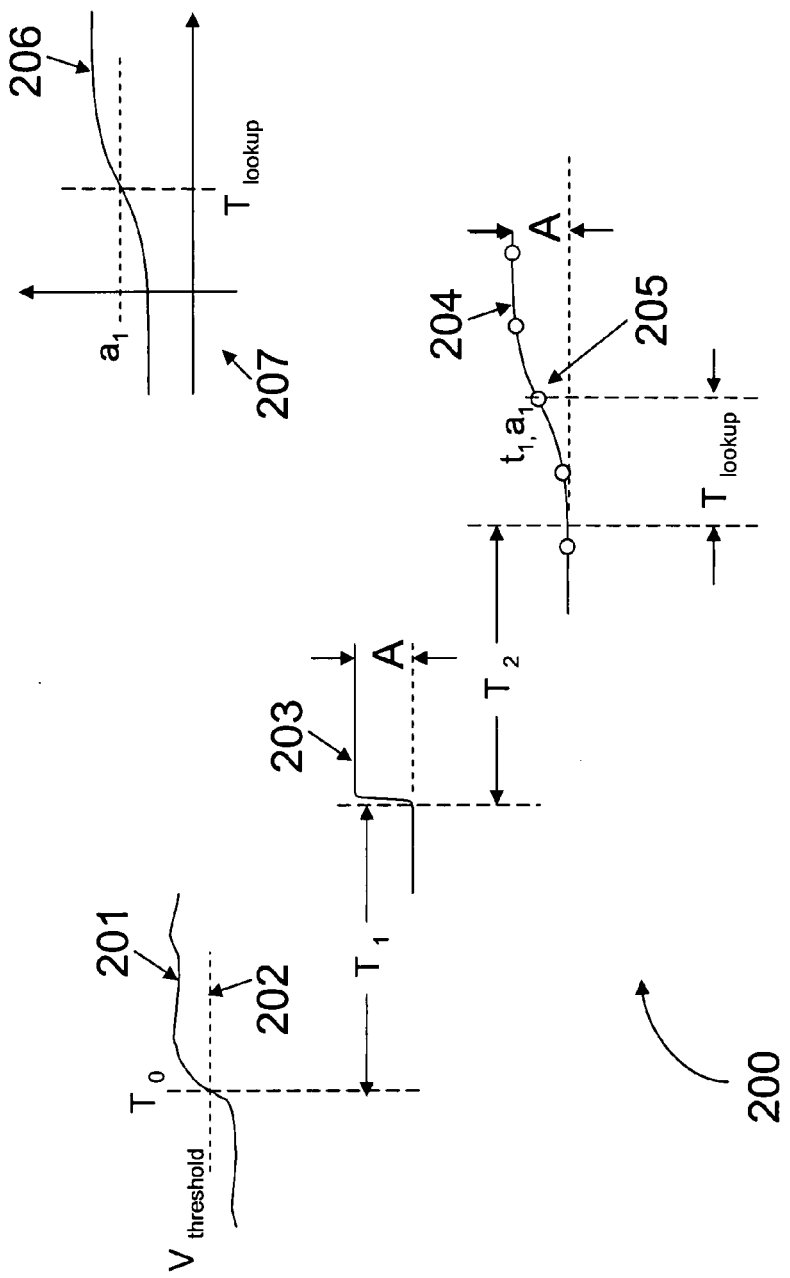
FIG. 2 illustrates waveforms at various points in the time measurement method.

FIG. 2 at 200 illustrates an example input waveform 201 which is applied to the comparator 102 o FIG. 1. The input waveform 201 crosses the static threshold voltage 202 at time $T_0$. For normal operating temperatures, the high and low amplitude values at the output of the comparator 102 are stable and unchanging as are the propagation delays of the comparator 102 and the filter 104 of FIG. 1. Still referring to FIG. 2, a resulting waveform transition 203 at the comparator output is initiated a fixed time $T_1$ after the crossing of the input threshold 202. The amplitude of the comparator output transition is fixed at an amplitude "A". At a fixed time $T_2$ later, the spread or stretched step 204 is initiated at the output of the filter 104 in FIG. 1. This waveform also has a fixed amplitude "A", with the shape over time being simply the step response of the filter. A series of amplitude measurement samples are taken with the ADC and data acquisition block 105 of FIG. 1. One such point is the point designated at 205 along the stretched step 204. This point has an amplitude and time associated with it ($t_1$,$a_1$) which is the result of the ADC amplitude measurement process.

It will be appreciated from FIG. 2 that to find the time when $V_{threshold}$ is crossed, one can work back from the point $t_1$,$a_1$ by subtracting $T_{lookup}$, $T_1$, and $T_2$ from the value of $t_1$ to get the value $T_0$. In the case of jitter, the only values of interest are the differences between transition locations with the result being that there is no real sense of absolute time. Consequently, if a constant time value were subtracted from all edge locations, such as $T_1+T_2$, then the time difference between edges would still remain the same. The implication of this in the context of locating $T_0$ is that all that needs to be subtracted from $t_1$ is $T_{lookup}$. The value of $T_{lookup}$ can be found if the characteristic shape of the expanded step 204 or reference waveform is known. Assuming that the reference waveform 204 is known or can be found, the lookup table 207 can be used to find the value of $T_{lookup}$ by identifying the ordinate value $a_1$ and locating the corresponding or abscissa value $T_{lookup}$. Subtracting $T_{lookup}$ from $t_1$ then produces a value representing the threshold crossing time.

One method for finding the reference waveform is to apply a clock like calibration signal of known frequency to the input of the comparator 102. The frequency of this calibration signal can be chosen to cause the sampling point 205 to appear to move slightly relative to the reference waveform with each successive calibration signal edge. Given that the calibration frequency is known, then a mathematical process of overlaying successive sampling points by subtracting the period of the calibration signal from the appropriate points yields a very high resolution record of a single reference waveform. Averaging, smoothing and curve fitting are candidates for creating a model of the reference waveform.

It will be appreciated in view of the disclosure, that even though the discussion has described events associated with rising steps and transitions, the described invention and embodiments also apply to events of the opposite polarity. Further, there also exist other reference waveforms that can be used to determine the times of the threshold crossings. An alternative to the application of a step to the filter is that of an impulse or a very short pulse. In this case the expanded waveform would appear as a spread out impulse in contrast to the step described above. Similar methods could be used for producing the threshold crossing times.

Figure 3:
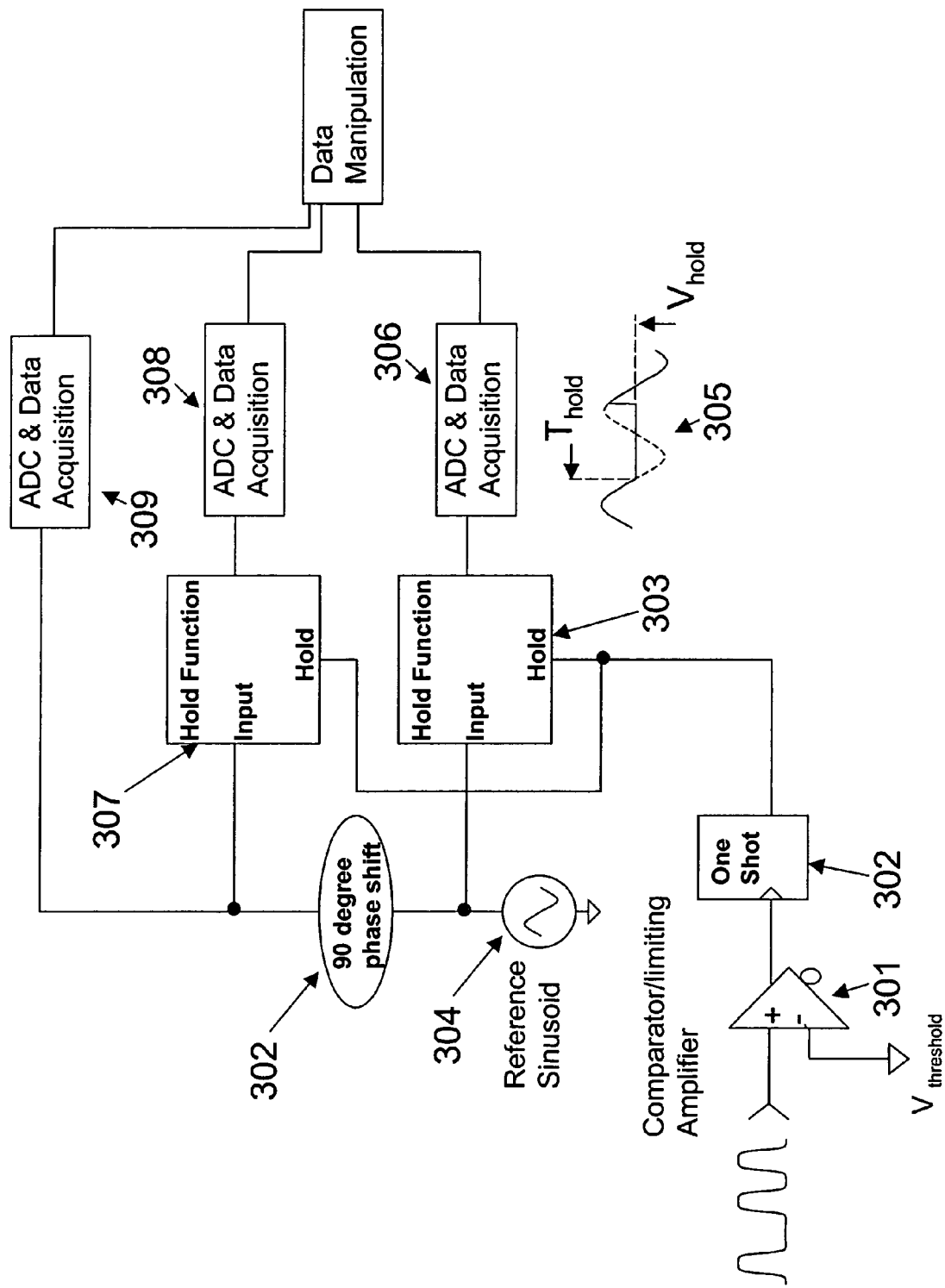
FIG. 3 illustrates the block diagram for an alternate time measurement method.

Another method for measuring the transition times is described in connection with FIG. 3. In this embodiment, a waveform is presented to the positive input of a comparator 301 while the negative input to the comparator is set to a voltage $V_{Threshold}$. The output of the comparator 301 is applied to the input of a one shot device 302 that creates a pulse of fixed width. The output of the one shot device 302 is applied to the hold input of a hold function device 303. A reference waveform such as a sinusoid 304 is applied to the input of the hold function device 303. The result at the output of the hold function device 303 is illustrated at 305, namely a sinusoid output that is held at a voltage $V_{hold}$ corresponding to the point in time $T_{hold}$ that the threshold transition occurred. This voltage is held for a period of time corresponding to the pulse width of the pulse generated by the one shot device 302. This output is applied to an analog to digital conversion (ADC) and data collection block 306 similar to the one described above.

Given the appropriate choice of reference frequency and sampling rate, a prescribed number of sample points will exist on the "held" portion of the output of the hold function device 303 (as shown at 305). If the shape of the reference waveform is well known, as in the case of a well filtered sinusoid, the location of the threshold crossing can be inferred by the held voltage. The phase of the sinusoid can be established by applying the sinusoid to another ADC and data acquisition element 309. It may be beneficial to have the output of the one shot drive two hold function devices 303 and 307. In this case the input to the hold functions would be reference sinusoidal waveforms that are out of phase by 90 degrees which is caused by the phase shift element 310. This would insure that one of the hold functions would be holding a voltage of sufficient slew rate as to accurately imply the threshold crossing. This implementation has the advantage of not relying on the accuracy of the sampling time base.

The output from the second hold function device 301 is provided to ADC and Data Acquisition block 309, while a data manipulation block 311 accepts the data from ADC and data acquisition blocks 306, 308 and 309.

Figure 4:
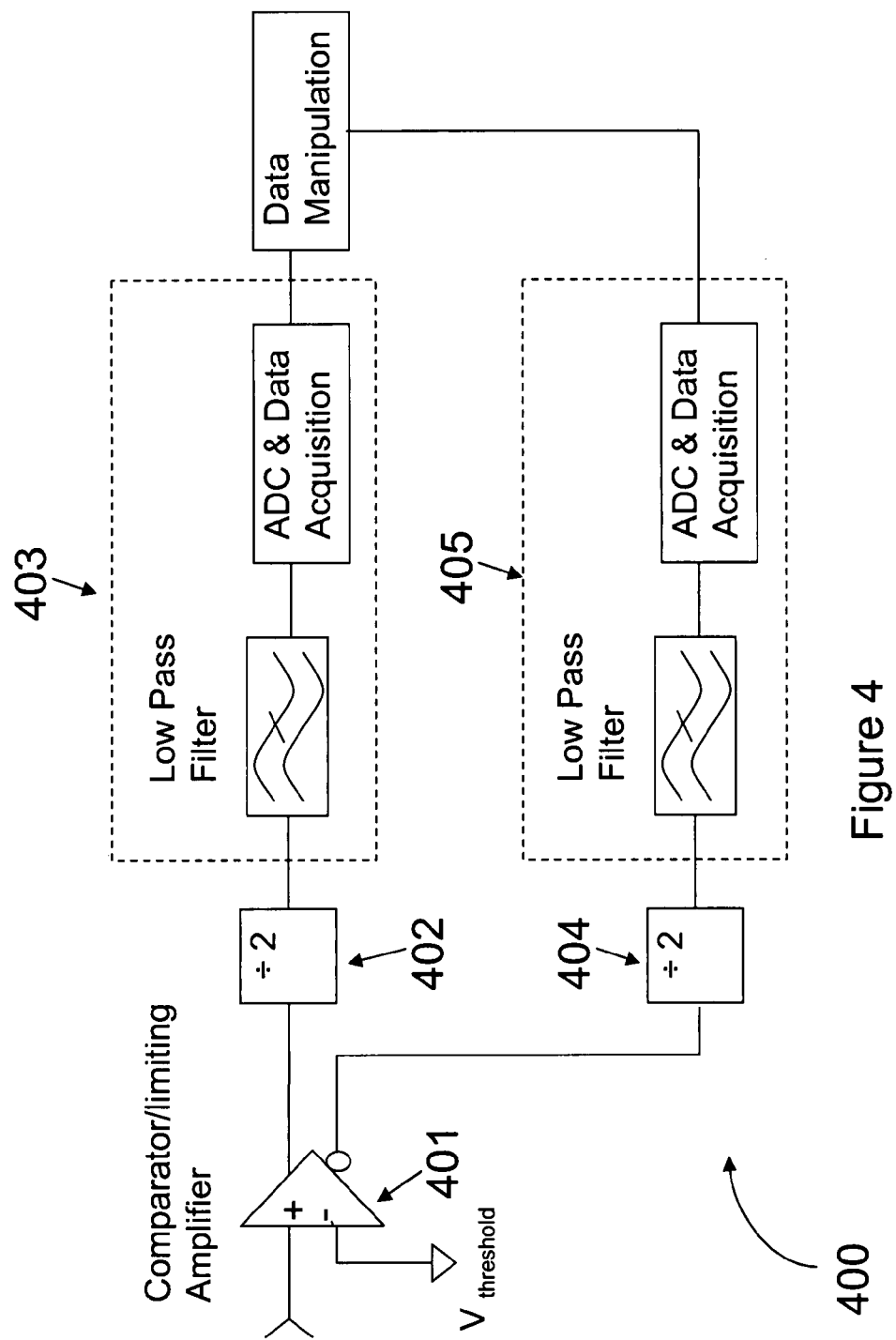
FIG. 4 illustrates a block diagram for a dividing scheme that extends the scalability of all of the time measurement schemes.

FIG. 4 illustrates an embodiment with two divider blocks 402 and 404 inserted into the measurement system. The non-inverting output of the comparator 401 is applied to the input of a first divider block 402. Assuming the dividers are positive edge triggered, then all positive transitions applied to the comparator 401 will cause a positive edge to be applied to the first divider 402. Since the divider block 402 is positive edge triggered, the output will only transition in response to all positive edges. The successive measurement circuit 403 will therefore only be able to respond to events with positive transitions. Conversely, the inverting output of the comparator 401 only transitions high in response to negative going threshold crossings at its input. The divider block 404 and the subsequent measurement channel thus only respond to negative going threshold crossings. The divider blocks 402 and 404 perform the function of cutting the frequency of edges entering the measurement channels 403 and 405 in half. This presents two options. First, if the hardware that would have been used for a single measurement channel is duplicated, then the system can be made to run at twice the data rate of a single channel system. The second option is, for a given data rate, that the number of measurement channels can be doubled, and the filter frequency, and the ADC and Data Acquisition rate, can be reduced by half. This can result in reduced cost since the cost of the ADC and Data Acquisition block may drop non-linearly. It is important to note that more than two dividers can be employed, thereby allowing a wide variety of configurations with regard to number of measurement channels. This permits the architecture to be very scalable.

An Oscilloscope Architecture Based on the Real Time Measurement Capability

Conventional equivalent time oscilloscopes depend on precision delay circuitry to create precise trigger locations for sampling waveforms. Precision for longer delay values is very difficult to achieve and the rate at which the trigger delay can be recycled can also be a measurement rate limitation. With the new time measurement capabilities of the present invention, the architecture shown in FIG. 5 can be implemented. Such architecture not only measures the sampled voltage, but also measures the time at which the sampling trigger occurred.

Figure 5:
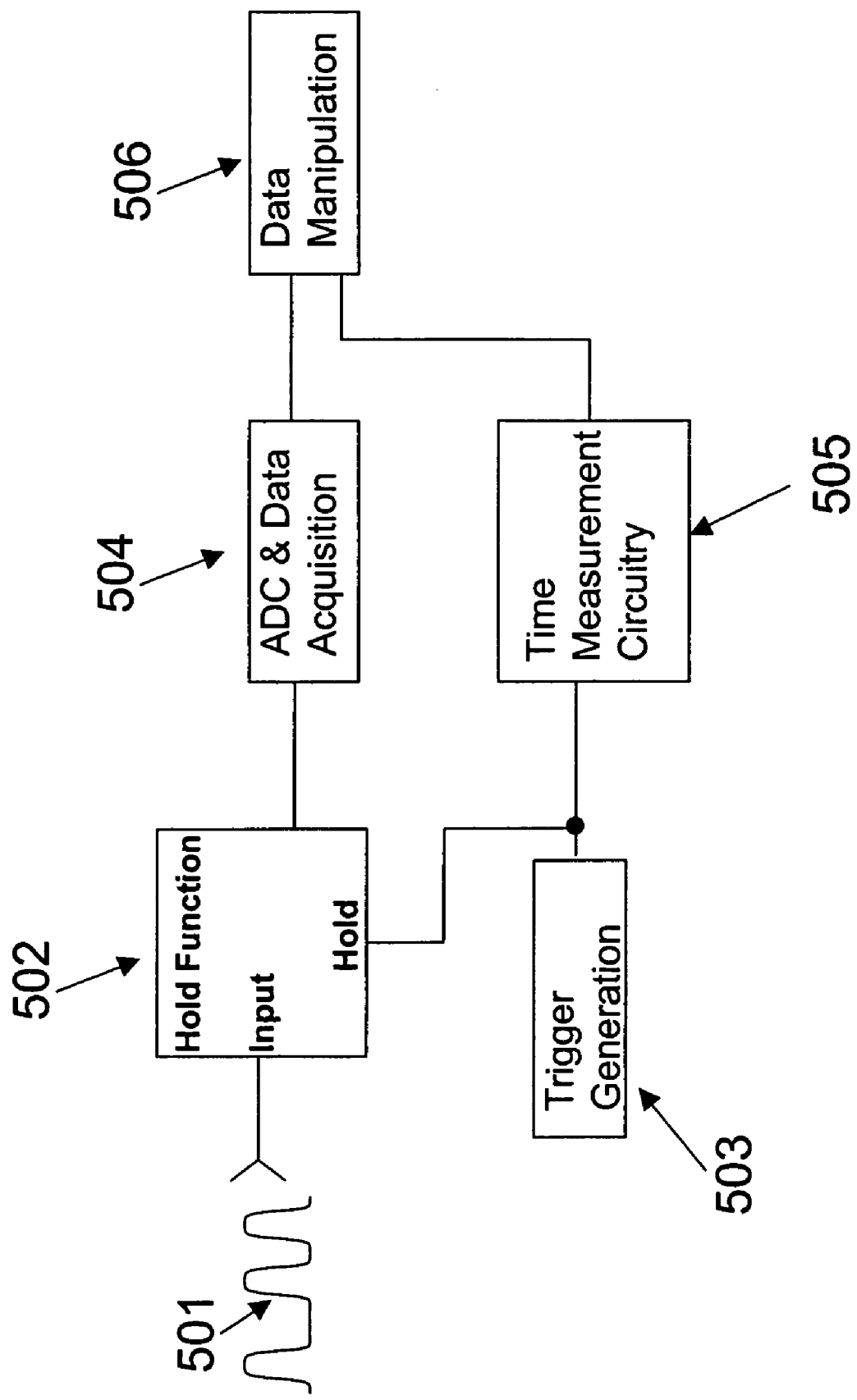
FIG. 5 illustrates the block diagram for an oscilloscope that utilizes the time previously described time measurement capability to improve system timing accuracy and measurement rate.

In FIG. 5, a waveform 501 to be measured is applied to the input of a hold function block 502. The hold function block 502 holds the incoming waveform 501 for a prescribed amount of time. The ADC and data acquisition block 504 samples the held voltage yielding the amplitude of the input to the hold function at the time of the trigger event. The output of the trigger generation circuit 503 is also applied to the input of the time measurement circuitry block 505 which measures the exact time of the trigger event. The long range accuracy of the time measurement method is far superior to the delay generation capability of current equivalent time oscilloscopes, thus providing greatly improved timing accuracy. The measurement rate afforded by the new time measurement block 505 removes the limitation of the delay recycle time that is imposed by current equivalent time oscilloscopes allowing measurement rates to be increased dramatically. The output is provided to data manipulation block 506.

Figure 6A:
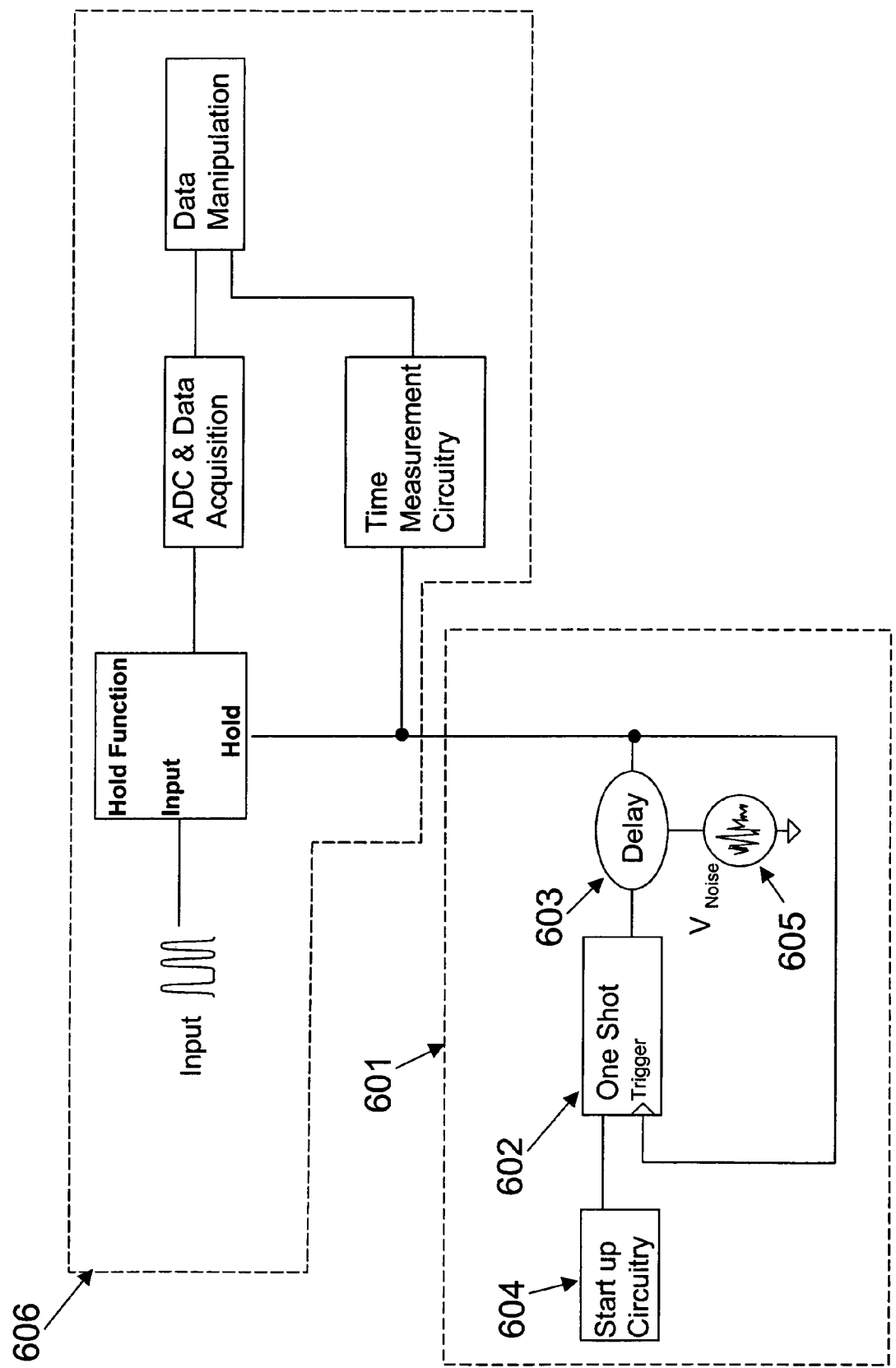
FIG. 6A illustrates the block diagram for an oscilloscope that incorporates a randomized trigger source for performing extremely fast eye diagram like oscilloscope measurements.

The embodiment illustrated in FIG. 6A utilizes this approach and is exemplary for measuring eye diagrams at a rate that is much higher than previously possible and without the need for a trigger signal. It also provides performance levels equal to or better than those of the equivalent time scope such as bandwidth, amplitude noise floor, jitter noise floor etc.

The configuration of this embodiment is similar to that shown in FIG. 5 with the block 606 comprising the various blocks illustrated in FIG. 5, with the exception of the trigger generation block 503. Instead, a randomized trigger source is illustrated in FIG. 6 generally at 601. The start up circuitry 604 initiates an edge on the one shot device 602 which is applied to the delay element 603. The propagation delay of the delay element 603 is a voltage controlled delay element. A random noise voltage source 605 is applied to the delay element 603 causing the delay to vary randomly over time. The output of the delay is applied to the amplitude and time acquisition system 606, and the one shot 602, retriggering the loop. The variation the delay element 603 is set so as to keep successive triggers from being time correlated. This causes the samples that are taken to be randomly spaced in time ensuring that a good distribution of times are sampled relative to the data rate of the signal. To that end the variation in delay should be a substantial portion of a bit period RMS.

Performance enhancement can be further achieved in several ways. For example, referring to FIG. 5, if the hold time of the track and hold block 502 is extended, then multiple samples of the voltage that is being held can be taken by the ADC and data acquisition block 504. The samples can then be averaged by the data manipulation block 506, which reduces the noise floor of the resulting amplitude measurement.

Figure 6B:
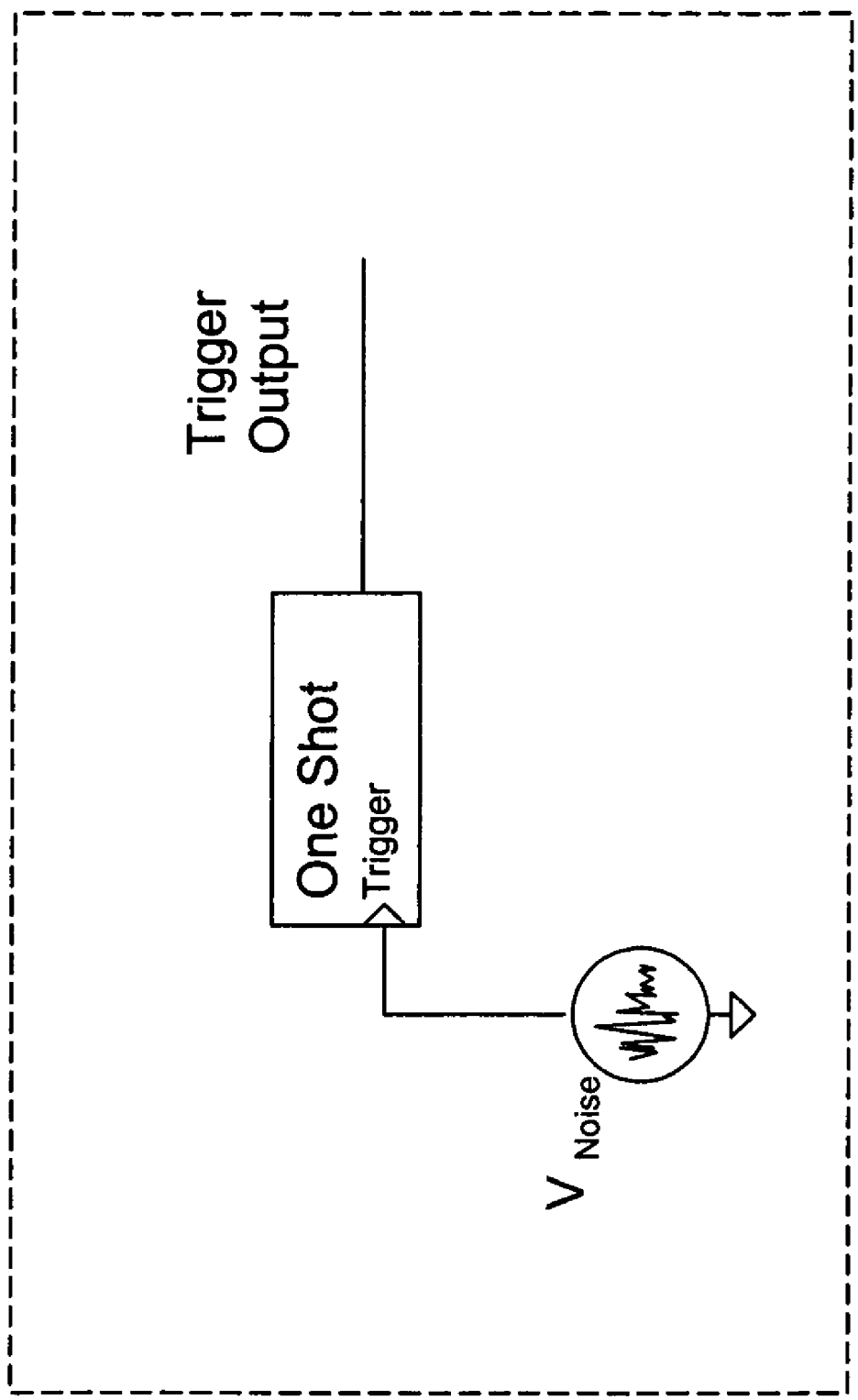
FIG. 6B depicts an alternative embodiment of a randomized trigger source.

An alternative embodiment of a randomized trigger source is depicted in FIG. 6B.

Figure 7:
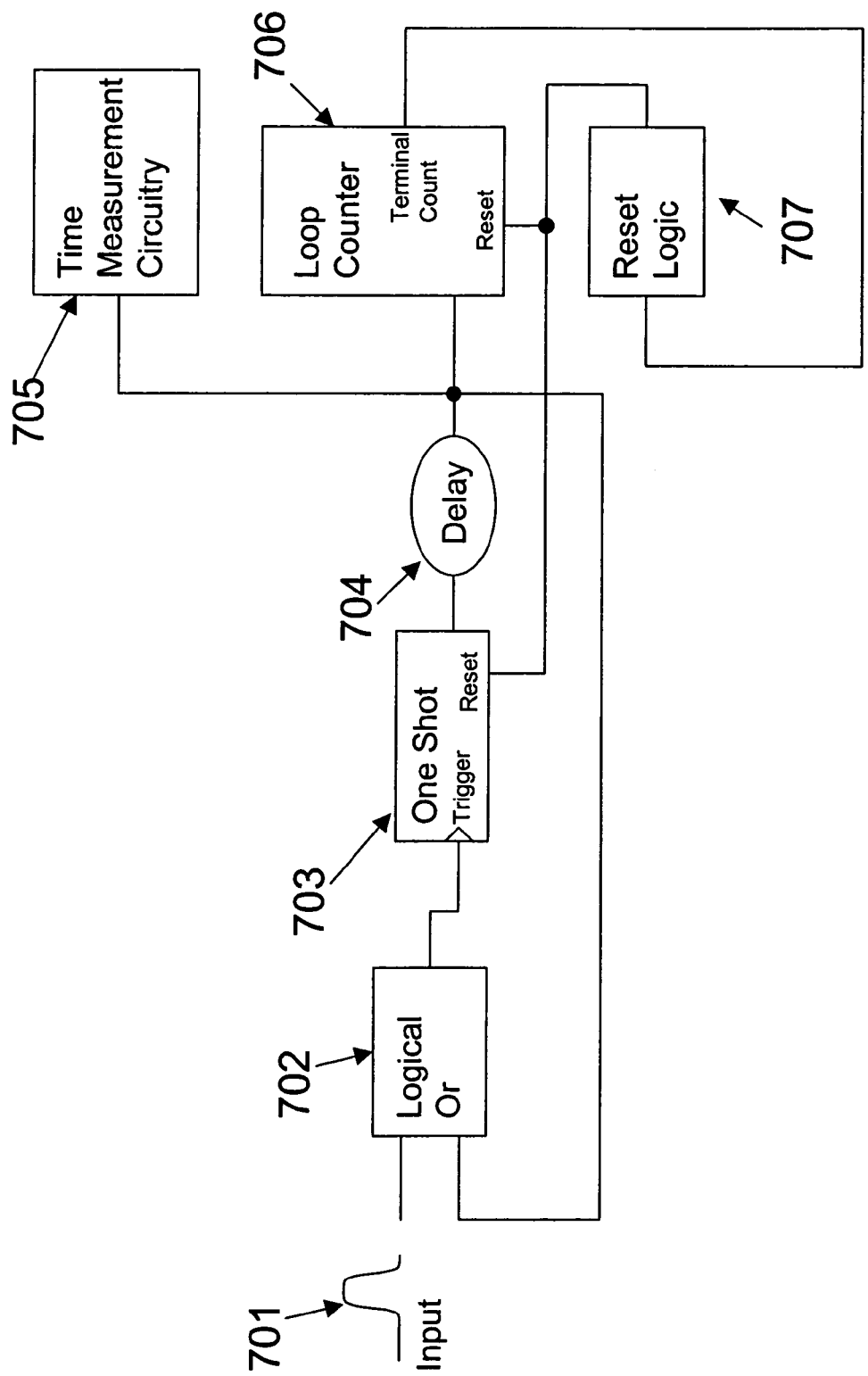
FIG. 7 illustrates a timing loop that is used to reduce the timing measurement error noise floor.

A circuit for reducing the time measurement error is shown in FIG. 7. Here, a single event represented by a transition 701 is applied to the input of the logical "or" block 702. Assuming that the other input is not asserted, then the output of the "or" block 702 transitions. This transition is applied to the input of the one shot device 703. The one shot device 703 creates a pulse of fixed width that is applied to the input of the delay element 704. The output of the delay element 704 is applied to three other elements. First it is applied to the time measurement circuitry 705 which measures the time of this transition utilizing the methods previously described. The output of the delay element 704 is also applied to the logical "or" block 702 causing the one shot to once again trigger. The output of the delay element 704 is also applied to the loop counter element 706 which counts the number of passes the loop has propagated. When the count reaches a terminal count the terminal count signal is asserted. The terminal count signal is then applied to the reset logic 707. The reset logic then asserts the reset inputs on the loop counter 706 and the one shot device 703, terminating the loop and resetting the counter 706.

The count value of the loop counter 706 can be programmable, and defines how many cycles an event is allowed to circulate before the loop is terminated. If the number of cycles is N and the jitter of the loop is small relative to the jitter of the time measurement circuitry 705, then the noise floor of the multiple pass measurement will drop the square root of N as compared to the single pass measurement.

Figure 8:
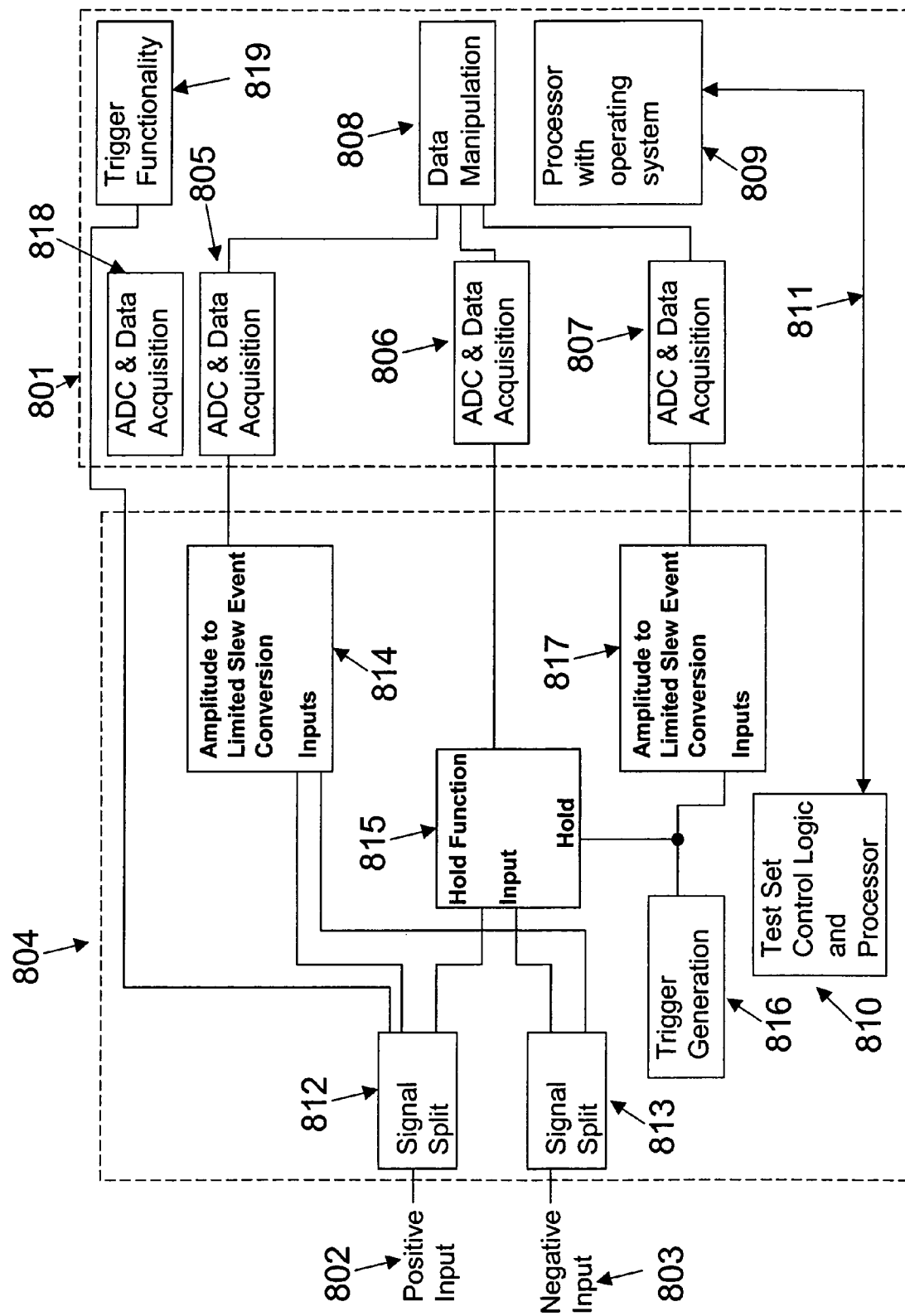
FIG. 8 illustrates a likely system configuration for the real time signal integrity oscilloscope that is capable of measuring amplitude and threshold crossing timing.

Although the systems referred previously can be constructed out of any components suitable to provide the described functionality, one preferred configuration is described in FIG. 8. The test set 804 contains circuitry that conditions and converts the input waveforms signals so that signals applied to a real time sampling oscilloscope 801. The real time sampling oscilloscope incorporates the ADC and data functionality 805, 806, 807 functions as well as the data manipulation functionality 808. The real time oscilloscope processor and operating system 809 runs a commonly available operating system (such the Windows operating system) and is capable of supporting other applications as well. Software for the system control and applications can reside on the real time oscilloscope processor system 809. The real time oscilloscope processor 809 can also perform the task of communicating with the test set control logic and processor 810. This communication will occur over suitable interconnect media 811 (e.g., an Ethernet connection).

FIG. 8 illustrates the test set 804 with differential signals 802, 803 applied, but a single ended signal could be applied as well. The signals 802, 803 are applied to splitting circuitry 812, 813 which split the input signals and apply them to the inputs of time measurement conditioning circuitry 814 and the differential track and hold circuitry 815 which is used for amplitude measurement. The output of the time measurement conditioning circuitry 814 exits the test set 804 and is applied to the ADC and data acquisition circuitry 805 in the real time oscilloscope 801 in order to perform the time measurement function described previously. The output of the time track and hold circuitry 815 exits the test set 804 and is applied to the ADC and data acquisition circuitry 806 in the real time oscilloscope 801 in order to perform the amplitude measurement function described previously. The trigger generation circuitry 816 creates the trigger events for the track and hold circuitry 815 which are also applied to the input of time measurement conditioning circuitry 817. The output of the time measurement conditioning circuitry 817 exits the test set 804 and is applied to the ADC and data acquisition circuitry 807 in the real time oscilloscope 801 in order to perform the time measurement function described previously. This configuration is capable of measuring the amplitude of the incoming differential waveforms and measuring the time of transitions on the waveforms simultaneously.

As will be appreciated by those of skill in the art upon a review of the present disclosure, the embodiments described herein are one of many that can be conceived to measure the timing and amplitude of waveforms with the concepts previously described for amplitude and time measurement.

The signal split 812 sends a signal out of the test set 804 which is applied to the ADC and data acquisition circuitry 818 in the real time oscilloscope 801. This signal can be used in conjunction with the real time oscilloscopes typically elaborate trigger function 819 to initiate a measurement.

Figure 10:
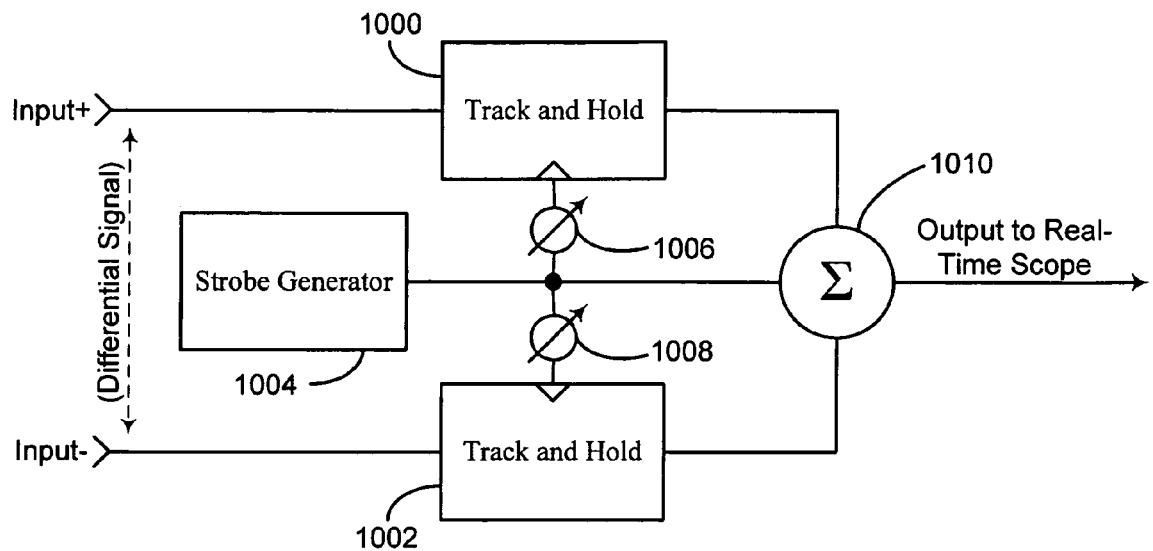
FIG. 10 depicts an embodiment of a sampling system, according to some embodiments of the present invention.

FIG. 10 depicts an alternative embodiment of the sampling method and system described herein. Briefly, the embodiment of FIG. 10 functions, so as to combine a timing signal with a signal to be sampled by a real-time sampling device, such as an accompanying real-time oscilloscope. For the sake of discussion, the real-time sampling device is referred to herein as a real-time oscilloscope, although this need not be the case, and the methods, systems, schemes, and techniques discussed herein may work in conjunction with an real-time sampling device. The effect of this embodiment is to reduce the number of input ports occupied on the aforementioned oscilloscope. As can be seen from FIG. 10, the relevant portion of the front-end device includes a pair of track and hold elements 1000 and 1002, respectively. The track and hold elements 1000 and 1002 are coupled to a differential input port of the front-end device. The first track and hold element 1000 receives the positive portion of the differential signal, and the second track and hold element 1002 receives the negative portion of the differential signal.

Each track and hold element 1000 and 1002 operates such that, upon the voltage at its track input exceeding a threshold, the voltage exhibited at its output tracks its input. The track input of each track and hold element 1000 and 1002 is provided with a fixed pulse width signal yielded from a strobe generator 1004. The signal yielded therefrom passes through a variable delay element 1006 or 1008 as it propagates to the track input of each track and hold element 1000 and 1002. The strobe generator 1004 is configured to generate a clock signal that exhibits track pulses at random points in time (in this case, a "track pulse" refers to an occurrence in which the voltage of the signal emanating from the strobe generator 1004 crosses the aforementioned threshold imposed by the track and hold elements 1000 and 1002 for a fixed period of time). Stated another way, the strobe generator 1004 generates track pulse signals exhibiting fixed pulse width that occur at random points in time, relative to the unit interval of the differential signal applied to the track and hold elements 1000 and 1002. The effect of such randomization is to ensure that, over the course of a sufficiently numerous set of measurements, voltage samples are taken at substantially all points in time of the aforementioned unit interval. The strobe generator 1004 is further configured to generate track pulses that are substantially identical in shape from track pulse to track pulses. Such substantial repeatability of shape may be obtained, for example, by use of a high-speed logic configured to perform a one-shot type of functionality.

As mentioned previously, variable delay elements 1006 and 1008 are interposed between the strobe generator 1004 and the track inputs of the track and hold elements 1000 and 1002. The delay imposed by each variable delay element 1006 and 1008 may be adjusted to compensate for the varying delays exhbited by the two track and hold elements 1000 and 1002, i.e., the delay exhibited, for each track and hold element, between the point in time at which a logic level transition is exhibited at its track input and the point in time at which the "holding" action of each element 1000 and 1002 commences. Thus, if the first track and hold element 1000 imposes a delay, $d_1$, and the second element imposes a delay, $d_2$, the first variable delay element 1006 may be adjusted to impose a delay of $d_2-d_1$, assuming that $d_2>d_1$.

The outputs of the track and hold elements 1000 and 1002, and the clock signal emitted by the strobe generator 1004 are combined by a summing node 1010 (the input receiving the output of the second track and hold element 1002 is negated). Accordingly, the output of the summing node 1010 yields a signal having the clock signal emitted by the strobe generator 1004 superimposed over the "held" signal to be measured by the real-time oscilloscope. An example of the signal yielded by the summing node 1010 is depicted in FIG. 11.

Figure 11:
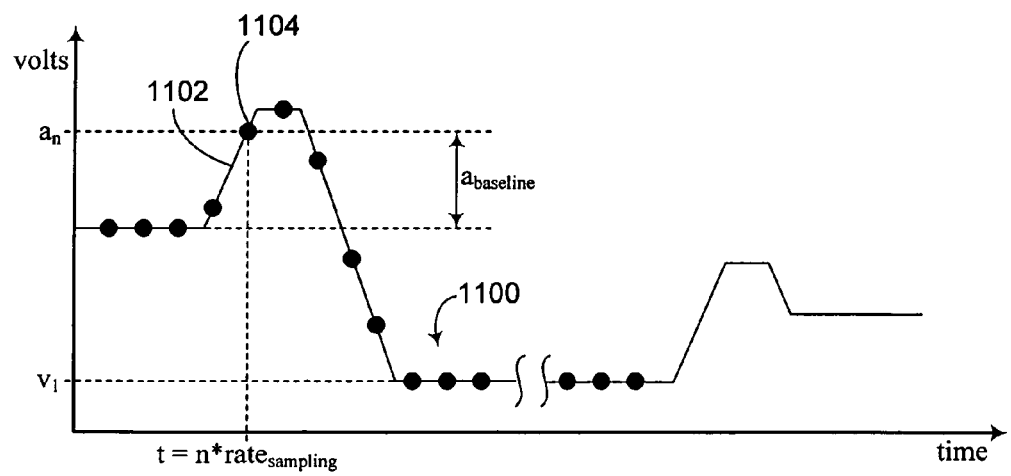
FIG. 11 depicts an exemplary signal emanating from the summing node of the sampling system of FIG. 10.

FIG. 11 depicts the output of the summing node 1010, immediately preceeding and following a point in time when a clock signal emitted by the strobe generator 1004 causes the track and hold elements 1000 and 1002 to sample an incoming differential signal having a voltage of $v_1$. As described previously, the output of the summing node 1010 is coupled to an input port of a real-time oscilloscope. Consequently, the signal emitted therefrom is sampled by the real-time oscilloscope at points in time determined by a clock internal to the oscilloscope. The various samples taken by the real-time measurement device, such as an oscilloscope are represented as darkened dots in FIG. 11.

The signal depicted in FIG. 11 exhibits a rising edge 11102. Following the rising edge 1102, the signal plateaus, after which, it exhibits a substantially constant voltage 1100 equal to the difference between the voltages held by the track and hold devices 1000 and 1002. Thus, by observing the voltage samples taken by the oscilloscope during the period of substantially constant amplitude 1100, the voltage level of the differential signal at a given sample time may be determined (e.g., the voltage levels may be averaged to reduce the effects of noise). Providing an adjustable hold time allows the measurement rate to be traded off for increased resolution and reduced noise floor.

It should be noted that many oscilloscopes exhibit a fixed signal to noise ratio. Such a fixed ratio may prove problematic when the difference between the amplitudes of successive held signals is relatively small, and the amplitude of the track pulse is disproportionately large, because the signal variations in the held signals will be corrupted by noise. Thus, according to some embodiments, the amplitude of the track pulse is a function of the difference of the amplitude of successive held signals.

Figures 12, 13:
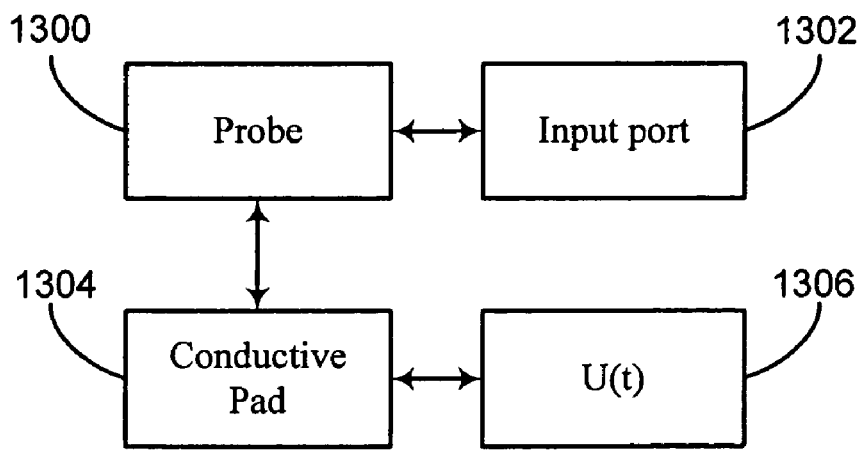
FIG. 12 depicts a table that may be accessed to obtain a correction factor, according to some embodiments of the present invention.
FIG. 13 depicts a system for correction of distortion caused by the combination of a probe, a front-end device, and circuitry within a real-time sampling device.

The track pulse is of a fixed duration, and the rising edge 1002 may be used to mate the aforementioned voltage level 1100 exhibited by the differential signal with a sample time. It is known that the hold time occurs at some point in time on the falling edge of the track pulse (this is because the sample and hold elements 1000 and 1002 operate, so as to perform their respective "hold" operations when the voltage at their respective track inputs falls beneath some threshold). Because the shape of the track pulse emitted from the strobe generator is substantially identical with each pulse, the hold time may be related to a sample obtained by the real-time oscilloscope, occurring on the rising edge 1102 of the track pulse. Thus, for example, the sample identified by reference numeral 1104 may be identified as occuring on the rising edge 1102 of the track pulse. After identifying this sample 1104 as occurring on the rising edge 1102 of the track pulse, its amplitude relative to the baseline voltage preceeding the rising edge 1102 is obtained. This amplitude is termed $a_{baseline}$. Then, because the shape of the track pulse is known, the amplitude of any point on the rising edge 1102 may be related to a correction factor that indicates the amount of time by which that point (e.g., point 1104) either preceeds or succeeds the sampling time. Accordingly, as shown in FIG. 12, a table relating the aforementioned value, $a_{baseline}$, to a correction factor may be accessed, and a particular correction factor associated with the value of $a_{baseline}$ may be retrieved (interpolation may be used, if needed). Then, the sample time may be arrived at by the following equation:

$$t_{sample} = n * \text{rate}_{sampling} + \text{factor}_{correction},$$

where n represents the sample number of the selected point on the rising edge of clock pulse (e.g., the selected point on the rising edge was the n=1067th sample in the sequence), $\text{rate}_{sampling}$ represents the sampling rate, and $\text{factor}_{correction}$ represents the aforementioned correction factor obtained from a table, such as the one described with reference to FIG. 12. (Of course $t_{sample}$, may be arrived at by use of a function or curve-fit procedure that generates values similar to those populating the table of FIG. 12.)

FIG. 13 depicts a system for obtaining a transfer function imposed by the combination of the particular probe used to interface the front-end device with a device under test, the front-end device, and the circuitry of the oscilloscope. It should be noted that many probes are configured to provide configuration data to the oscilloscope with which they are coupled. The configuration data informs the oscilloscope of the transfer function imposed by the probe, so that the oscilloscope can substantially correct any distortion created by the probe. The following scheme permits the front-end device disclosed herein to function with a probe having an unknown transfer function, and does not require the front-end device to read any configuration data stream provided by the probe, in order to determine the transfer function imposed thereby.

The system includes a probe 1300 for interfacing with the device under test, and for obtaining the signal to be measured. The probe 1300 interfaces with an input port 1302 provided by the front-end device described herein. The front-end device is provided with a conductive pad 1304 located on a surface accessible by a user of the device. The conductive pad 1304 is coupled to a step function generator 1306 (in principle, the step function generator 1306 can generate any known function having wide band frequency content, but for the sake of example, the generator 1306 is described herein as a step function generator). The step function generator 1306 may actually generate a slow square wave, which in the context of the data rates to be measured by the front-end device and oscilloscope fulfills the role of a step function. The generator 1306 may be composed of, for example, a precision oscillator coupled to a high-performance comparator, so that the square wave/step function yielded thereby is of substantially the same shape with each cycle.

At the time of manufacture, a time-sequenced set of voltages describing one cycle of the signal emitted by the step function generator 1306 may be stored in a memory device within the front-end device. This time-sequenced set of voltages may be termed u(t). Alternatively or additionally, a Fourier transform of u(t) may be stored in the aforementioned memory device. The transform of u(t) may be termed u($\omega$).

Figure 14:
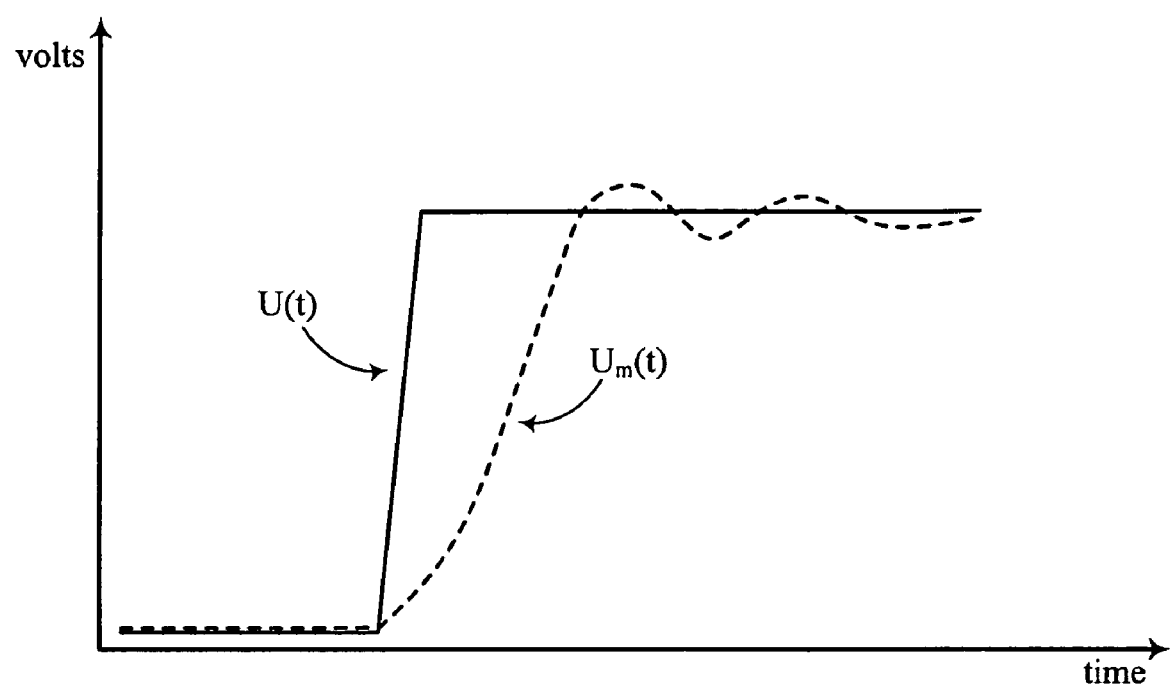
FIG. 14 depicts a step signal that is generated and measured by the system of FIG. 13.

To obtain the transfer function imposed by the combination of the probe 1300, the front-end device, and the circuitry of the oscilloscope, the probe 1300 may be put into electrical contact with the conductive pad 1304. Consequently, the combination formed by the front-end device and the oscilloscope cooperate to measure the step function, u(t), using the aforementioned sampling technique discussed herein (in other words, the measurement is built up, sample-by-sample, over the course of many successive measurements, as is known in the art). Therefore, the oscilloscope obtains a time-sequenced set of voltages describing the step function, as observed by the oscilloscope's measurement circuitry. This time-sequenced set of voltages is distorted by the transfer function of the probe, front-end device, and measurement circuitry of the oscilloscope, meaning it is not equal to the time-sequenced set of voltages stored in the front-end device. (In other words u(t) and $u_m$(t) may differ, as shown in FIG. 14). The time-sequenced set of voltages describing the step function as measured by the oscilloscope may be termed $u_m$(t). Again, the Fourier transform of $u_m$(t) may be found, and stored in the memory of the oscilloscope (or stored in any other computing system in communication therewith, including the front-end device). The transform of $u_m$(t) may be termed $u_m$($\omega$).

It is known that $u(\omega) \cdot P(\omega) \cdot E(\omega) = u_m(\omega)$, where P($\omega$) represents, in frequency space, the transfer function imposed by the probe, and E($\omega$) represents, in frequency space, the transfer function imposed by the combination of the front-end device and the circuitry of the oscilloscope. Therefore, $P(\omega) \cdot E(\omega) = u_m(\omega)/u(\omega)$. Thus, the quantity arrived at by dividing $u_m(\omega)$ and $u(\omega)$ may be stored in memory of the oscilloscope or any other device in communication therewith, including the front-end device or another computer, and used to correct measurements. The correction herein may be performed using either spectral or time domain techniques.

For example, in the case of a signal X(t) having been measured using the sampling technique discussed herein (again, by "measured" it is meant that the signal is built up, on a sample-by-sample basis over the course of many iterations of the repeating pattern), the signal may be corrected by the aforementioned quantity, according to any of a number of known techniques. X(t) may be transformed into frequency space, becoming X($\omega$). Then, X($\omega$) may be corrected by multiplication by $u(\omega)/u_m(\omega)$. Thereafter, the resulting product may be inverse-transformed back into time space, and the results may be displayed by the oscilloscope, or otherwise used in the normal manners that oscilloscopes use sample data.

It is to be noted that any of the foregoing data manipulation schemes described with reference to any of the foregoing Figures, including those described with reference to Figures with reference to FIGS. 10-14 may be stored as a set of instructions in a memory device or any form of computer-readable medium. The instructions may be executed by any processor having access to the data to be manipulated, including, without limitation, a processor embedded in an oscilloscope mated to the front-end device described herein, a processor within the front-end device, or a computer in communication with either the oscilloscope or the front-end device.

It will be appreciated that the principles of this invention apply not only to devices for measuring time voltage threshold events, but also to other environments in which the measurement of time varying parameters and functions is desirable. While particular embodiments of the invention have been described with respect to its application, it will be understood by those skilled in the art that the invention is not limited by such application or embodiment or the particular components disclosed and described herein. It will be appreciated by those skilled in the art that other components that embody the principles of this invention and other applications therefor other than as described herein can be configured within the spirit and intent of this invention. The arrangements described herein are provided as examples of embodiments that incorporate and practice the principles of this invention. Other modifications and alterations are well within the knowledge of those skilled in the art.

The claimed invention is:

1. A method of determining a time of occurrence of a logic level transition in a signal, the method comprising:

providing the signal to a comparator, so that, at an output of the comparator, a step signal having a substantially predetermined shape is generated, upon the signal exhibiting a logic level transition;

filtering the step signal, yielding a filtered step signal exhibiting a slowed transition from a first voltage level to a second voltage level;

sampling the filtered step signal with a signal measurement device, so as to obtain at least one sample of the slowed voltage transition;

using the at least one sample of the slowed voltage transition and the substantially predetermined shape of the step signal to determine the time of occurrence of the logic level transition; and providing the time of occurrence of the logic level transition to an oscilloscope for use therein.

2. The method of claim 1, wherein the signal measurement device associates the at least one sample of the slowed voltage transition with a point in time, relative to a start of a data record, at which the sample was obtained, and wherein the act of using the at least one sample of the slowed voltage transition and the substantially predetermined shape of the step signal to determine the time of occurrence of the logic level transition comprises:

accessing a table to obtain an offset value based upon the at least one sample of the slowed voltage transition; and adding the offset value to the point in time associated with the sample.

3. The method of claim 2, wherein the table is populated with offset values determined based upon the predetermined shape of the step signal.

4. The method of claim 3, wherein the table is populated with offset values determined based upon a known shape of the slowed transition from a first voltage level to a second voltage level.

5. The method of claim 4, wherein the signal measurement device comprises an oscilloscope.

6. The method of claim 1, wherein the signal measurement device comprises an oscilloscope.

7. The method of claim 1, wherein the act of filtering the signal is performed such that the voltage level transition occurs over a sufficiently lengthy period of time, so that the signal measurement device is certain to obtain at least one sample of the slowed voltage transition, given a sampling rate imposed by the signal measurement device.

8. The method of claim 1, wherein the signal measurement device exhibits a low-pass characteristic, and wherein the act of filtering the signal comprises providing the signal to the signal measurement device.

* * * * *